United States Patent [19]
Onishi et al.

[11] Patent Number: 5,459,368
[45] Date of Patent: Oct. 17, 1995

[54] SURFACE ACOUSTIC WAVE DEVICE MOUNTED MODULE

[75] Inventors: Keiji Onishi, Settsu; Shunichi Seki, Osaka; Yutaka Taguchi, Ibaraki; Kazuo Eda, Nara, all of Japan

[73] Assignee: Matsushita Electric Industrial Co., Ltd., Osaka, Japan

[21] Appl. No.: 278,905

[22] Filed: Jul. 22, 1994

[30] Foreign Application Priority Data

Aug. 6, 1993 [JP] Japan .................... 5-195872

[51] Int. Cl.$^6$ .................................. H01L 41/08
[52] U.S. Cl. ........................ 310/313 R; 310/344
[58] Field of Search .................. 310/313 R, 313 B, 310/313 C, 313 D; 333/150, 155, 193, 195, 196

[56] References Cited

U.S. PATENT DOCUMENTS

| | | | |
|---|---|---|---|
| 4,683,394 | 7/1987 | Koshino | 310/313 R |
| 4,734,608 | 3/1988 | Takashima et al. | 310/313 R |
| 4,736,128 | 4/1988 | Takoshima et al. | 310/313 R |
| 4,737,742 | 4/1988 | Takoshima | 333/150 |
| 4,795,934 | 1/1989 | Rogerson et al. | 310/313 R |
| 5,202,652 | 4/1993 | Tabuchi et al. | 333/193 |
| 5,237,235 | 8/1993 | Cho et al. | 310/313 R |
| 5,281,883 | 1/1994 | Ikata et al. | 310/313 R |

FOREIGN PATENT DOCUMENTS

| | | | |
|---|---|---|---|
| 0534251A1 | 3/1993 | European Pat. Off. | |
| 2283112 | 11/1990 | Japan | |
| 3019416 | 1/1991 | Japan | |
| 5-251980 | 9/1993 | Japan | 310/313 R |
| 6-006169 | 1/1994 | Japan | 310/313 R |
| 6-053775 | 2/1994 | Japan | 310/313 R |

OTHER PUBLICATIONS

English Language European Search Report dated Dec. 23, 1994.
Miniaturized SAW Devices for Radio Communication Transceivers (pp. 2–8).

The Development of a Surface Mount Hybrid if Section Using Low Loss Saw Filters, (pp. 283–288).

Chip–on–Glass Packaging Technology Using Conductive Particles (pp. 99–103).

Flip Chip Assembly of of Surface Aoustic Wave Devices (pp. 36–39).

*Primary Examiner*—Mark O. Budd
*Attorney, Agent, or Firm*—Fish & Richardson

[57] ABSTRACT

This invention provides a surface acoustic wave device mounted module which is miniature, light, and highly reliable. The surface acoustic wave device mounted module also has excellent frequency characteristics. The surface acoustic wave device mounted module includes a multilayer substrate which has at least one layer of a shield pattern, input-output electrodes, grounding electrodes, through holes used for connecting electrodes, and a surface acoustic wave element. The surface acoustic wave element has metallic bumps, which are transfer-coated with a conductive resin, on electrode pads and an insulating resin around the surface acoustic wave element. The electrode pads are input-output terminals and grounding terminals formed on the surface acoustic wave element. Continuities between the input-output terminals and the input-output electrodes, and between the grounding terminals and the grounding electrodes are established by the through holes. An electrode pattern is formed on the surface of the multilayer substrate facing and surrounding the surface acoustic wave element. A metallic lid is attached to the electrode pattern by a solder or a conductive resin so that the surface acoustic wave element is sealed in an airtight condition. The electrode pattern is connected to the grounding electrodes by the through holes.

13 Claims, 7 Drawing Sheets

SURFACE ACOUSTIC WAVE DEVICE MOUNTED MODULE

FIELD OF THE INVENTION

The invention relates to a surface acoustic wave device mounted module for mobile communication equipment.

BACKGROUND OF THE INVENTION

Along with the recent development of mobile communication technologies, the need for a miniature and lightweight surface acoustic wave device mounted module with improved electrical characteristics, which is used as an interstage reception filter, an interstage transmission filter and an antenna filter for mobile communication equipment, has been increasing.

A conventional surface acoustic wave (SAW) device mounted module, for example, is described in IEEE Transactions on Vehicular Technology, vol. 38, No. 1 (1989), pp.2–8. This conventional SAW device mounted module has a surface acoustic wave element mounted on a can-like package. An aluminum wire provides continuity across the input-output terminals of the package and the surface acoustic wave element. Or, instead of a can-like package with protruding input-output terminals, a package which can be mounted on plates such as a ceramic package has recently been requested, particularly for mobile communication equipment. For this type of package and a can-like package, however, a bonding wire is required to establish continuity with surface acoustic wave element. Therefore, the miniaturization of a SAW device mounted module is limited when one of these packages is used for the SAW device mounted module, since the height of the bonding wire is limited and a land for the bonding wire is required on the package.

A face down bonding (or flip chip bonding) is used as a method of miniaturizing a SAW device mounted module. In this method, the surface acoustic wave element faces a circuit substrate and conductive bumps are used to establish continuity across the element and the substrate. In other words, a bonding wire is not required in this method.

Use of the face down bonding method to a surface acoustic wave element is mentioned in Proceedings on 1984 Ultrasonics Symposium (1984), pp. 36–39. However, when this method is applied to a mobile communication equipment, the equipment cannot be miniaturized or kept in an airtight condition. Another applied example of the face down bonding method is mentioned in Proceedings on IMC Symposium (1992), pp. 99–103. The problems typical to a surface acoustic wave element make it difficult to apply the face down bonding method to a SAW device mounted module. For example, a surface acoustic wave element applied for mobile communication equipment, in particular, uses a piezoelectric substrate with high pyroelectricity, so that when a frequency band (pass band frequency for a surface acoustic wave element used as a band pass filter) is high, the line width of an inter-digital transducer (IDT) used for the element ranges from 0.5 μm to 1 μm. Therefore, when the temperature changes by processes of forming conductive bumps, the IDT is likely to be broken by the pyroelectricity of the substrate. In addition, a space around the surface acoustic wave element is required for smooth propagation of surface acoustic waves along the functional surface of the element.

In other methods of miniaturizing mobile communication equipment, a surface acoustic wave element is combined with a matching circuit or integrated with other parts. The combination of the element with the matching circuit is particularly required when the element is used as an IF (intermediate frequency) filter for mobile communication equipment. If the IF filter is applied as a surface acoustic wave element, input-output impedances generally become high so that an impedance matching circuit is required to connect the element with an outside circuit. An example of an integrated circuit including a surface acoustic wave element (IF section) is mentioned in Proceedings on Ultrasonics Symposium (1986), pp. 283–288. In this example, packaged devices are integrated with each other into one body so that this method is not effective in miniaturizing mobile communication equipment.

A conventional SAW device mounted module disclosed in Published Unexamined Japanese Patent Application No. Hei 5-291864 is manufactured by the steps of:

forming gold or aluminum bumps on electrode pads of a surface acoustic wave element;

transfer-coating a conductive resin on top of the bumps;

placing the bumps on the surface of a ceramic substrate formed with a wiring pattern;

heating and curing the conductive resin to bond the element to the ceramic substrate; and adding an insulating resin around the element to increase the adhesion between the element and the substrate.

In this conventional SAW device mounted module, a space is provided around the IDT of the SAW element, and the viscosity of insulating resin is arranged to prevent adhesion of the resin to the IDT. A metal lid is attached to the substrate by an insulating resin and the SAW element is kept in an airtight condition. As another advantage of this SAW device mounted module, IDT is not broken during the manufacturing processes since the element is not exposed to a high temperature in this method.

This conventional SAW device mounted module, however, includes a monolayer ceramic substrate, and only a two-dimensional wiring is used with this SAW device mounted module. Therefore, the size of the SAW device mounted module is large when an impedance matching circuit is formed on the ceramic substrate or when a module is formed by integrating the surface acoustic wave element with other parts. Since a wiring pattern is formed on the surface of the ceramic substrate, a metal lid cannot be sealed by a conductive material, so the electromagnetic shield of this conventional SAW device mounted module becomes insignificant.

SUMMARY OF THE INVENTION

This invention provides a surface acoustic wave device mounted module which is miniature, lightweight, and highly reliable. The SAW device mounted module also has excellent frequency characteristics.

In order to provide its advantages, the surface acoustic wave device mounted module of the invention comprises a multilayer substrate which includes at least one layer of a shield pattern, input-output electrodes, grounding electrodes and through holes used for connecting the electrodes; and a surface acoustic wave element placing an inter-digital transducer to face the multilayer substrate and having metallic bumps, which are transfer-coated with a conductive resin, on electrode pads and an insulating resin around the surface acoustic wave element. The electrode pads are input-output terminals and grounding terminals formed on the surface acoustic wave element. Continuities across the input-output terminals and the input-output electrodes, and across the grounding terminals and the grounding electrodes are established by the through holes. An electrode pattern is formed on the surface of the multilayer substrate to surround the surface acoustic wave element. A metallic lid is attached to the electrode pattern by a solder or a conductive resin so that the surface acoustic wave element is sealed in an airtight condition by the metallic lid. The electrode pattern is connected to the grounding electrodes by the through holes.

It is preferable that the surface acoustic wave element is a piezoelectric substrate and that the piezoelectric substrate is at least one material selected from the group consisting of lithium tantalate, lithium niobate, lithium borate, and quartz.

It is preferable that an electrode pattern is formed on the multilayer substrate to face the inter-digital transducer of the surface acoustic wave element and that a continuity is established between the electrode pattern and the grounding electrodes or the shield pattern by the through holes.

It is preferable that a conductive film is formed on the top surface of the surface acoustic wave element and that a continuity is established between the metallic lid and the top surface by the conductive film.

It is also preferable that a continuity is established between the top surface of the surface acoustic wave element and the metallic lid by a conductive resin.

It is preferable that the bumps are made of at least one metal selected from the group consisting of gold and aluminum.

It is preferable that the surface acoustic wave element is mounted on the flat surface of the multilayer substrate.

It is also preferable that the surface acoustic wave element is mounted on the depression in the multilayer substrate.

It is preferable that a circuit element is applied to the multilayer substrate to match with the input-output impedances of an outside circuit.

The invention also provides a surface acoustic wave device mounted module comprising a multilayer substrate which includes at least one layer of shield pattern, input-output electrodes, grounding electrodes, and through holes used for connecting the electrodes; a surface acoustic wave element placing an inter-digital transducer to face the multilayer substrate and having metallic bumps, which are transfer-coated with a conductive resin, on electrode pads and an insulating resin partially or entirely surrounding the surface acoustic wave element; and other active or passive components. The electrode pads are input-output terminals and grounding terminals formed on the surface acoustic wave element. The surface acoustic wave element and the other active or passive components are integrated in one body on the multilayer substrate. An electrode pattern is formed on the multilayer substrate to surround the surface acoustic wave element. A metallic lid is attached to the electrode pattern by a solder or a conductive resin to seal the surface acoustic wave element in an airtight condition. The electrode pattern is connected to the grounding electrodes by the through holes.

It is preferable that the surface acoustic wave element is mounted on the depression in the multilayer substrate.

It is preferable that the electrode pattern is formed on the multilayer substrate to surround the surface acoustic wave element and the active or passive components in one body.

It is preferable that the bumps are made of at least one metal selected from the group consisting of gold and aluminum.

DETAILED DESCRIPTION OF THE INVENTION

The invention will be explained in detail with reference to the attached figures and the following examples. The examples are illustrative and should not be construed as limiting the invention in any way.

EXAMPLE 1

Figure 1:
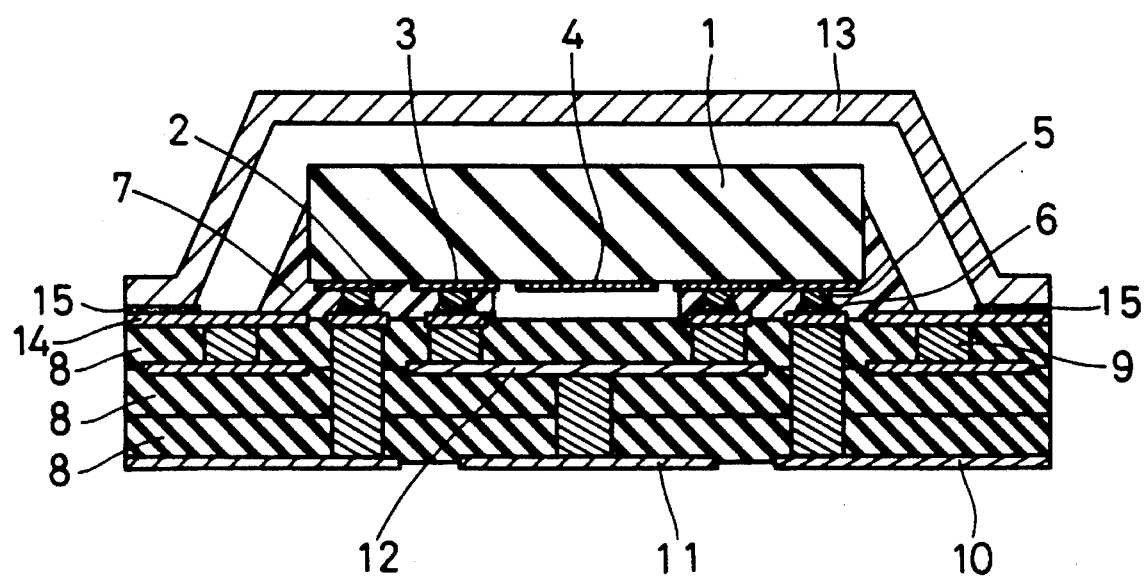
FIG. 1 is a cross sectional view of a surface acoustic wave device mounted module of a first embodiment of the invention.

FIG. 1 shows a cross-sectional view of a surface acoustic wave device mounted module of a first embodiment. A surface acoustic wave element 1 is a piezoelectric substrate made of at least one material selected from the group consisting of lithium niobate, lithium tantalate, lithium borate, and quartz. An input-output terminal 2, a grounding terminal 3, and an inter-digital transducer (IDT) 4 are formed on surface acoustic wave element 1 by a conventional photolithography. These elements are made of aluminum alloy or gold alloy. In this figure, 5 is a gold or aluminum bump; 6 is a conductive resin; 7 is an insulating resin; and 8 is a multilayer substrate. The insulating resin 7 is used to increase the adhesion of the SAW element 1 to the substrate. A through hole 9, an input-output electrode 10, a grounding electrode 11, and a shield pattern 12 are applied to multilayer substrate 8 and form a conductor substantially made of silver or copper. A metallic lid 13 is attached to a grounding electrode pattern 14 by a conductive adhesive layer 15 comprising a conductive resin or a solder. Grounding electrode pattern 14 is formed on the surface of multilayer substrate 8, which faces surface acoustic wave element 1, and surrounds the element.

Therefore, the surface acoustic wave device mounted module can shield electromagnetic energy more efficiently than a conventional surface acoustic wave device mounted module and has excellent electrical characteristics. The surface acoustic wave device mounted module was manufactured by the following steps:

forming metallic IDT 4 mainly made of aluminum, input-output terminals 2 and grounding terminals 3 on one surface of a 36° Y-X lithium tantalate piezoelectric substrate (surface acoustic wave element 1) by a conventional photolithography, thus forming a multielectrode surface acoustic wave filter, which can be used as an interstage filter for mobile communication equipment;

attaching metal wires about 25 μm in diameter on electrode pads (input-output terminals 2 and grounding terminals 3) by a conventional ball bonding machine to form conductive bumps 5 about 80 μm in bottom surface diameter and about 50 μm in height;

facing the bumps towards a horizontal base and adding about 5 g weight on each conductive bump 5 to limit the difference in height of the bumps to within 45±1 μm;

dipping the end of bumps 5 in conductive resin 6 which was a heat-curing epoxy resin containing Ag—Pd alloy particles and was coated on the horizontal base at a uniform thickness, thereby transfer-coating the resin on bumps 5;

placing bumps 5 on electrodes, which were formed on a multilayer substrate 8 and were connected to input-output electrodes 10 by through holes, and on electrodes, which were formed on the substrate and were connected to grounding electrodes 11 by through holes;

curing conductive resin 6;

coating a highly viscous heat-curing silicon insulating resin 7 around surface acoustic wave element 1 without the surface acoustic wave element contacting IDT 4;

curing the silicon insulating resin at 120° C. to strengthen the adhesion between surface acoustic wave element 1 and multilayer substrate 8 and to keep IDT 4 in an airtight condition; and adhering metallic lid 13 to grounding electrode pattern 14 by an Au—Sn alloy.

An alumina-glass ceramic was used as a dielectric for multilayer substrate 8. A copper electrode, which was prepared by baking a copper oxide paste in a reducing atmosphere, was used for through hole 9 and shield pattern 12 as an inside electrode. It is, however, preferable to use an electrode paste containing glass for through hole 9 to provide an improved airtight condition in the through hole. A copper electrode plated with nickel/gold was used for the electrodes, which were formed on multilayer substrate 8 and were connected to input-output electrodes 10 by through holes, and the electrodes, which were formed on the substrate and were connected to grounding electrodes 11 by through holes, as an outside electrode.

Furthermore, grounding electrode pattern 14 was connected to shield patterns 12 by through holes 9, and metallic lid 13 was adhered to the grounding electrode pattern. Therefore, an electromagnetic shield was provided at the surface acoustic wave device mounted module. The surface acoustic wave device mounted module had proper frequency characteristics. Also, by applying a grounding electrode pattern between the input and output electrodes on the multilayer substrate, the electromagnetic shield can be improved. Compared with a conventional surface acoustic wave device mounted module, the surface acoustic wave device mounted module of the example had an improvement in stop band supression by about 10 dB.

The resins were sufficiently heat-resistant against a three-minute solder reflow at 250° C. Even though a glass-ceramic multilayer substrate was used, the same effects can be provided by using a glass fiber sheet containing an epoxy resin as the multilayer substrate.

EXAMPLE 2

Figure 2:
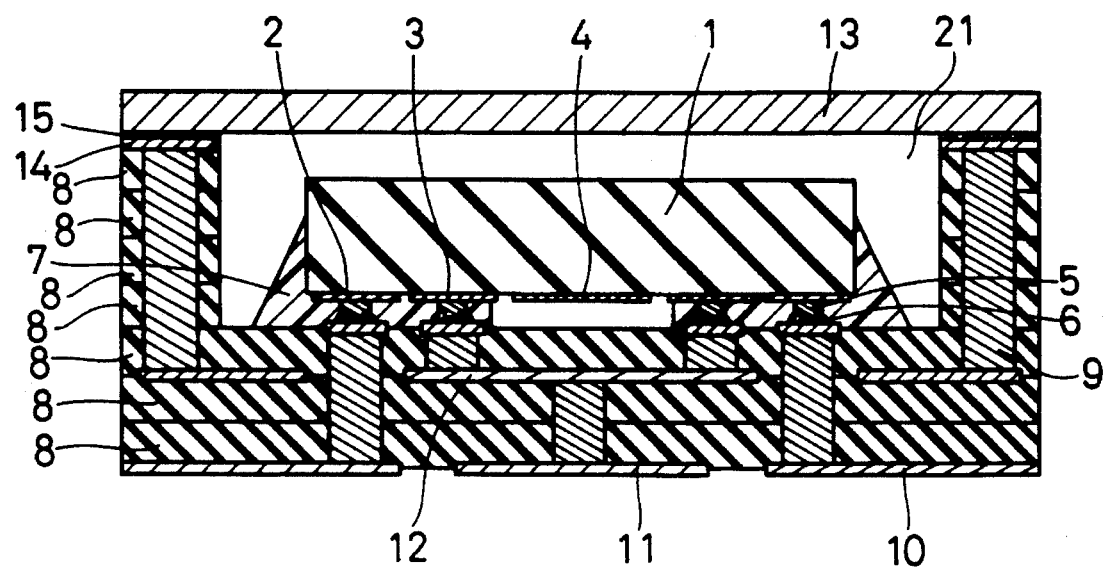
FIG. 2 is a cross sectional view of a surface acoustic wave device mounted module of a second embodiment of the invention.

As shown in FIG. 2, a multilayer substrate 8 has a depression 21 inside. Elements similar to elements previously described in FIG. 1 are not redescribed here to prevent redundancy. A surface acoustic wave element is installed inside depression 21. The surface acoustic wave device mounted module has the same properties as the surface acoustic wave device mounted module of FIG. 1. The problem in the surface acoustic wave device mounted module of Example 1 that insulating resin 7 may stick to grounding electrode pattern 14 is solved by the surface acoustic wave device mounted module of this example.

EXAMPLE 3

Figure 3:
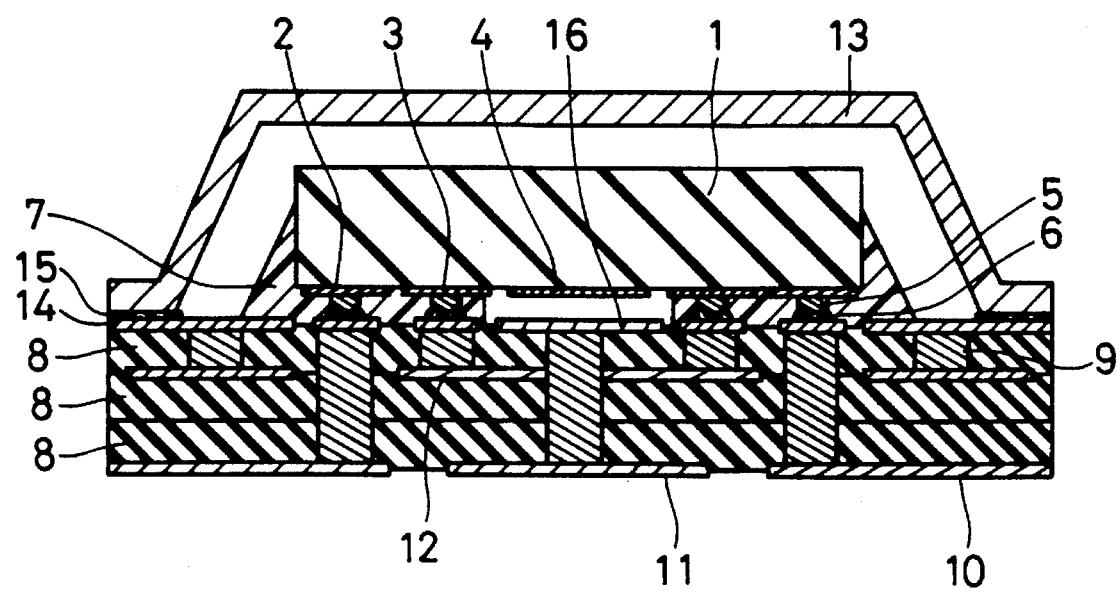
FIG. 3 is a cross sectional view of a surface acoustic wave device mounted module of a third embodiment of the invention.

FIG. 3 shows a cross-sectional view of a third embodiment of a surface acoustic wave device mounted module. Elements similar to elements previously described in FIG. 1 are not redescribed here to prevent redundancy. In this figure, a counter-electrode pattern 16 is formed on a multilayer substrate 8 and faces IDT 4 formed on surface acoustic wave element 1. Counter-electrode pattern 16 is connected to grounding electrode 1 1 and a shield pattern 12 by a through hole 9. Thus, the effect of directly propagated electromagnetic waves between input and output electrodes on the surface acoustic wave element is reduced, and the electrodes are sufficiently isolated from each other. When this surface acoustic wave element is used as a band pass filter, the surface acoustic wave device mounted module has excellent frequency characteristics, particularly in stop band supression.

EXAMPLE 4

Figure 4:
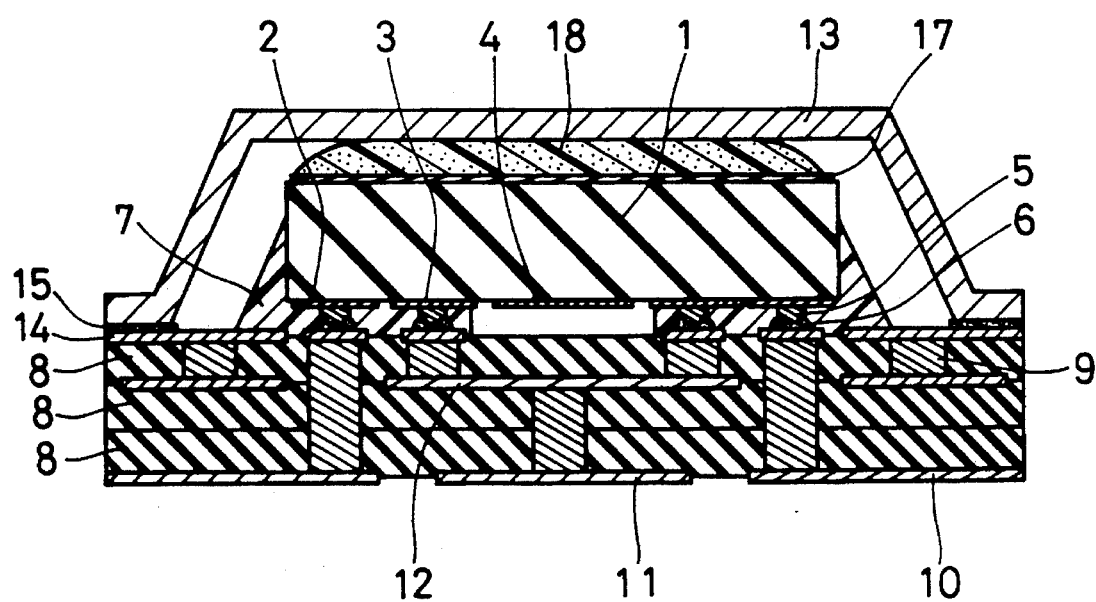
FIG. 4 is a cross sectional view of a surface acoustic wave device mounted module of a fourth embodiment of the invention.

FIG. 4 shows a cross-sectional view of a fourth embodiment of a surface acoustic wave device mounted module. Elements similar to elements previously described in FIG. 1 are not redescribed here to prevent redundancy. In this figure, a metal film substantially made of aluminum or gold is formed as a back contact electrode 17 on the surface of a surface acoustic wave element 1 opposite the surface on which IDT 4 is formed. A conductive resin 18 provides continuity between back contact electrode 17 and lid 13. Thus, a sufficient electromagnetic shield is provided for the surface acoustic wave device mounted module and the effect of a stray capacitance is reduced. Compared with a conventional surface acoustic wave device mounted module, this surface acoustic wave device mounted module has improved frequency characteristics.

The properties of the surface acoustic wave device mounted module would be the same, even if back contact electrode 17 is not formed on the surface acoustic wave element and the back surface of the element is connected to the metallic lid by the conductive resin.

EXAMPLE 5

Figure 5:
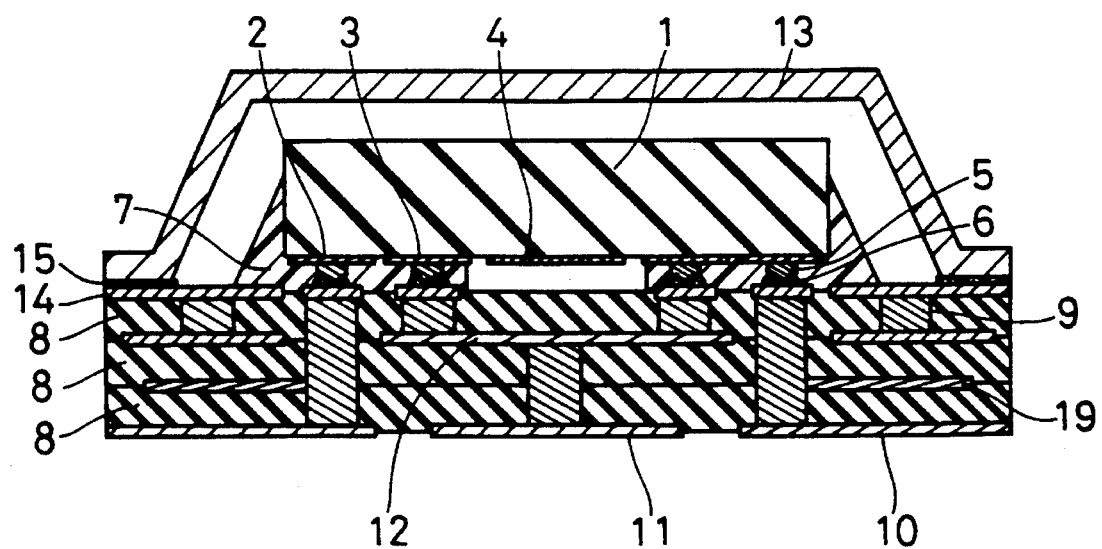
FIG. 5 is a cross sectional view of a surface acoustic wave device mounted module of a fifth embodiment of the invention.

FIG. 5 shows a cross-sectional view of a fifth embodiment of a surface acoustic wave device mounted module. Elements similar to elements previously described in FIG. 1 are not redescribed here to prevent redundancy. In this figure, 19 is a matching circuit for matching the input-output impedances with an outside circuit. For example, a filter used at an intermediate frequency band of mobile communication equipment generally has high impedances so that the matching circuit must match the impedances between input-output terminals and outside circuit.

A longitudinal mode coupled resonator filter, which uses a quartz substrate and is used for mobile communication equipment, is used as a surface acoustic wave element 1. Inside multilayer substrate 8, a stripline used as an inductor (coil) and an open stub functioning as a capacitor are connected in series or in parallel with each other to form matching circuit 19. As a result, the input-output impedances are matched with the outside circuit.

The packaging area of the surface acoustic wave device mounted module including the matching circuit is much smaller than the packaging area required for a conventional surface acoustic wave device mounted module. As a result, mobile communication equipment can be miniaturized. Also, the cost of manufacturing the surface acoustic wave device mounted module is reduced since the number of parts required for the surface acoustic wave device mounted module is reduced from the conventional level.

EXAMPLE 6

Figure 6:
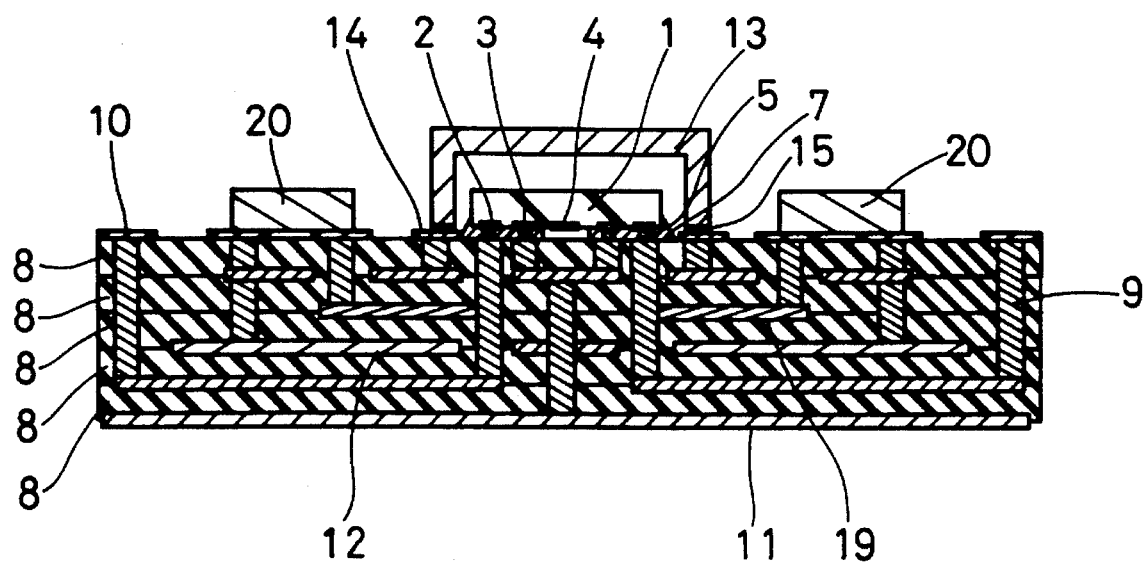
FIG. 6 is a cross sectional view of a surface acoustic wave device mounted module of a sixth embodiment of the invention.

FIG. 6 shows a cross-sectional view of a sixth embodiment of a surface acoustic wave device mounted module. Elements similar to elements previously described in FIG. 1 are not redescribed here to prevent redundancy. In this figure, 20 is a passive component or an active component which is functional when it is combined with a surface acoustic wave element 1. In this composition, modules can be integrated with each other. For example, an antenna reception filter, an interstage reception filter, a local oscillating filter, and a first intermediate frequency filter are mounted on a multilayer substrate 8 as surface acoustic wave element 1, while an amplifier and a mixer are mounted in one body on the substrate as passive component 20, thus forming a reception module. Also, a matching circuit 19 is formed on the multilayer substrate to match the impedances between the surface acoustic wave element and the other elements. Thus, a high frequency circuit used for the receiver of mobile telephones becomes hybrid and a miniaturized high frequency reception module is provided.

Similarly, a high frequency transmitter such as an antenna shared device where the surface acoustic wave element is used as an input-output band pass filter, or a voltage controlled oscillator where the element is used as an oscillator can also be miniaturized.

EXAMPLE 7

Figure 7:
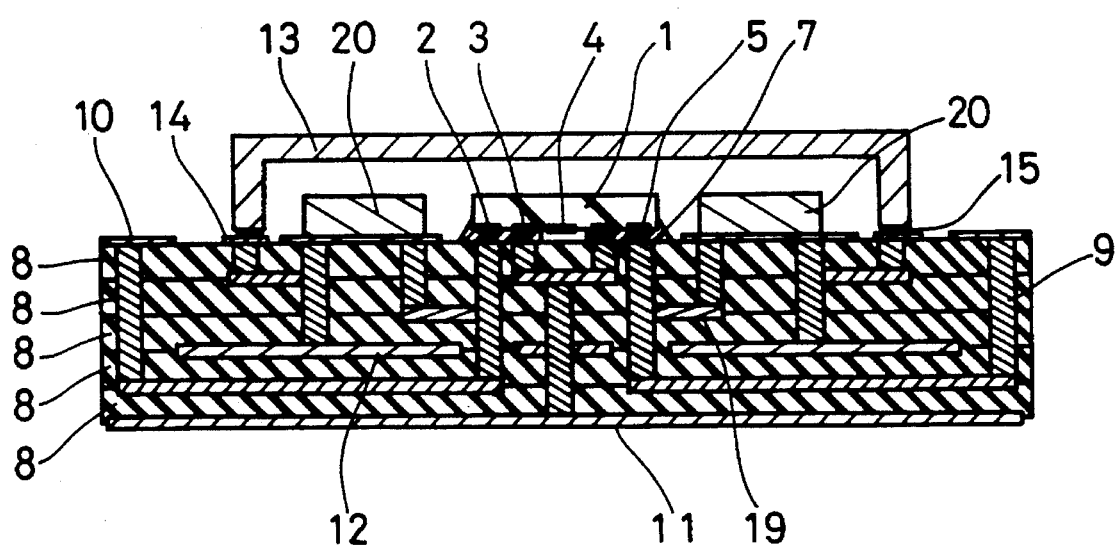
FIG. 7 is a cross sectional view of a surface acoustic wave device mounted module of a seventh embodiment of the invention.

FIG. 7 shows a cross-sectional view of a seventh embodiment of a surface acoustic wave device mounted module. Elements similar to elements previously described in FIG. 1 are not redescribed here to prevent redundancy. Although only a surface acoustic wave element 1 is sealed by a metallic lid 13 in Example 6, an entire module is sealed in an airtight condition by metallic lid 13 in this example. Since elements, which are individually sealed by a lid in a conventional surface acoustic wave device mounted module, are sealed by a lid in one body, packaging costs are reduced.

Instead of a heat-curing silicon insulating adhesive used to increase the adhesion between surface acoustic wave element 1 and multilayer substrate 8, a low-melting point glass, having a melting point of around 280° C., can be used. In order to reduce the effects of an unnecessary reflective wave from the top surface of the surface acoustic wave element, the top surface can be roughened. Also, by applying sound absorbing material to the top surface of the surface acoustic wave element, a surface acoustic wave device mounted module having excellent frequency characteristics is provided.

The invention may be embodied in other forms without departing from the spirit or essential characteristics thereof. The embodiments disclosed in this application are to be considered in all respects as illustrative and not restrictive. The scope of the invention is indicated by the appended claims rather than by the foregoing description, and all changes which come within the meaning and range of equivalency of the claims are intended to be embraced therein.

We claim:

1. A surface acoustic wave device mounted module, comprising:

a multilayer substrate comprising at least one layer of shield electrode pattern, input-output electrodes, grounding electrodes and through holes used for connecting electrodes; and a surface acoustic wave element placing a inter-digital transducer to face said multilayer substrate, said surface acoustic wave element having metallic bumps, which are transfer-coated with a conductive resin, on electrode pads and an insulating resin partially or entirely disposed around said surface acoustic wave element;

wherein said electrode pads are input-output terminals and grounding terminals formed on said surface acoustic wave element;

wherein continuities between said input-output terminals and said input-output electrodes, and between said grounding terminals and said grounding electrodes are established by said through holes;

wherein a continuous grounding electrode pattern is formed on a surface of said multilayer substrate surrounding said surface acoustic wave element;

wherein a metallic lid is attached to said continuous grounding electrode pattern by a solder or a conductive resin so that said surface acoustic wave element is sealed in an airtight condition by said metallic lid; and wherein said continuous grounding electrode pattern is connected to said grounding electrodes by said through holes.

2. The surface acoustic wave device mounted module according to claim 1, wherein the surface acoustic wave element is a piezoelectric substrate, and wherein said piezoelectric substrate is at least one material selected from the group consisting of lithium tantalate, lithium niobate, lithium borate and quartz.

3. The surface acoustic wave device mounted module according to claim 1, wherein the multilayer substrate comprises a grounding electrode pattern on its surface facing an inter-digital transducer of the surface acoustic wave element, said grounding electrode pattern having continuity with the grounding electrodes or the shield electrode pattern by the through holes.

4. The surface acoustic wave device mounted module according to claim 1, wherein the surface acoustic wave element comprises a conductive film on a surface opposite a surface facing the multilayer substrate to establish continuity between the metallic lid and said conductive film by a conductive resin.

5. The surface acoustic wave device mounted module according to claim 1, wherein the metallic lid has a continuity with a surface of the surface acoustic wave element opposite a surface facing the multilayer substrate by a conductive resin.

6. The surface acoustic wave device mounted module according to claim 1, wherein the bumps are made of at least one metal selected from the group consisting of gold and aluminum.

7. The surface acoustic wave device mounted module according to claim 1, wherein the surface acoustic wave element is mounted on a flat surface of the multilayer substrate.

8. The surface acoustic wave device mounted module according to claim 1, wherein the surface acoustic wave element is mounted in a depression formed in the multilayer substrate.

9. The surface acoustic wave device mounted module according to claim 1, wherein the multilayer substrate comprises circuit elements to match input-output impedances of surface acoustic wave element with those of outside circuits.

10. A surface acoustic wave device mounted module, comprising:

- a multilayer substrate comprising at least one layer of shield electrode pattern, input-output electrodes, grounding electrodes and through holes used for connecting electrodes;
- a surface acoustic wave element placing an inter-digital transducer facing said multilayer substrate, said surface acoustic wave element having metallic bumps, which are transfer-coated with a conductive resin, on electrode pads and an insulating resin partially or entirely disposed around said surface acoustic wave element; and
- active components or passive components;
- wherein said electrode pads are input-output terminals and grounding terminals formed on said surface acoustic wave element;
- wherein said surface acoustic wave element and said active components or passive components are integrated into one body on said multilayer substrate;
- wherein a continuous grounding electrode pattern is formed on said multilayer substrate surrounding said surface acoustic wave element;
- wherein a metallic lid is attached to said continuous grounding electrode pattern by a solder or a conductive resin to seal said surface acoustic wave element in an airtight condition by said metallic lid; and
- wherein said continuous grounding electrode pattern is connected to said grounding electrodes by said through holes.

11. The surface acoustic wave device mounted module according to claim 10, wherein the surface acoustic wave element is mounted in a depression of the multilayer substrate.

12. The surface acoustic wave device mounted module according to claim 10, wherein the electrode pattern is formed on the multilayer substrate so as to surround the surface acoustic wave element and the active components or passive components in one body.

13. The surface acoustic wave device mounted module according to claim 10, wherein the bumps are made of at least one metal selected from the group consisting of gold and aluminum.

\* \* \* \* \*